(12) United States Patent
Kishimoto

(10) Patent No.: US 10,756,727 B2
(45) Date of Patent: Aug. 25, 2020

(54) SWITCHING CIRCUIT AND HIGH-FREQUENCY MODULE

(71) Applicant: Murata Manufacturing Co., Ltd., Kyoto (JP)

(72) Inventor: Ken Kishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/497,411

(22) Filed: Sep. 26, 2014

(65) Prior Publication Data

US 2015/0180467 A1 Jun. 25, 2015

(30) Foreign Application Priority Data

Dec. 24, 2013 (JP) .................................. 2013-265318

(51) Int. Cl.
*H03K 17/30* (2006.01)
(52) U.S. Cl.
CPC .................................. *H03K 17/302* (2013.01)
(58) Field of Classification Search
CPC .................................................. H03K 17/302
See application file for complete search history.

(56) References Cited

U.S. PATENT DOCUMENTS

| | | | |
|---|---|---|---|
| 5,886,394 A * | 3/1999 | Leeuwenburgh | H01F 5/003 257/531 |
| 7,254,371 B2 * | 8/2007 | Inui | H03K 17/002 455/73 |
| 7,860,499 B2 * | 12/2010 | Burgener | H01P 1/15 257/341 |
| 8,960,558 B1 * | 2/2015 | MacKenzie | G06K 19/07749 235/492 |
| 9,143,184 B2 * | 9/2015 | Gorbachov | H01P 1/15 |
| 2003/0090313 A1 | 5/2003 | Burgener | |
| 2012/0157029 A1 * | 6/2012 | Matsuura | H04H 20/106 455/253.2 |

(Continued)

FOREIGN PATENT DOCUMENTS

| | | |
|---|---|---|
| JP | 58-085810 U | 6/1983 |
| JP | 02-018586 Y2 | 5/1990 |
| JP | H05-014081 A | 1/1993 |

(Continued)

OTHER PUBLICATIONS

Notice of Reasons for Rejection issued in corresponding Japanese Patent Application No. 2013-265318 dated Sep. 15, 2015.

(Continued)

*Primary Examiner* — Lincoln D Donovan
*Assistant Examiner* — Colleen J O Toole
(74) *Attorney, Agent, or Firm* — Pearne & Gordon LLP

(57) ABSTRACT

A switching circuit includes a first input/output terminal, a second input/output terminal, a third input/output terminal, a first transistor, a second transistor, an inductor and a resistor. The first transistor is electrically connected between the first input/output terminal and the second input/output terminal. The second transistor is electrically connected between the first input/output terminal and the third input/output terminal. The inductor and the resistor are electrically connected in series with each other between the second input/output terminal and the third input/output terminal.

12 Claims, 25 Drawing Sheets

(56) References Cited

U.S. PATENT DOCUMENTS

2012/0262217 A1  10/2012  Gorbachov

FOREIGN PATENT DOCUMENTS

| | | |
|---|---|---|
| JP | H09-023101 A | 1/1997 |
| JP | 09-107203 A | 4/1997 |
| JP | 10-200302 A | 8/1998 |
| JP | H10-209835 A | 8/1998 |
| JP | 2001-068984 A | 3/2001 |
| JP | 2001-251101 A | 9/2001 |
| JP | 2006-109084 A | 4/2006 |
| JP | 2011-199375 A | 10/2011 |

OTHER PUBLICATIONS

Third Party Submission issued in Japanese Patent Application No. 2013-265318 dated Aug. 18, 2015.

* cited by examiner

SWITCHING CIRCUIT AND HIGH-FREQUENCY MODULE

BACKGROUND OF THE INVENTION

1. Field of the Invention

The present invention relates to a switching circuit and to a high-frequency module equipped with the switching circuit.

2. Description of the Related Art

A high-frequency switch is a switch for switching between high-frequency signal transmission paths. For example, in a wireless communication device such as a cellular phone or a wireless local area network (LAN), a high-frequency switch is used to switch between frequency bands or switch between a transmission path of a transmission signal and a transmission path of a reception signal.

For example, a single pole double throw (SPDT) switching circuit is disclosed in Japanese Unexamined Patent Application Publication No. 9-107203. This switching circuit aims to obtain high isolation at desired frequencies. The switching circuit switches between a first transmission path that transmits a signal from an input/output terminal to a reception terminal and a second transmission path that transmits a signal from a transmission terminal to the input/output terminal. The switching circuit includes an inductor that is provided between the transmission terminal and the reception terminal.

According to Japanese Unexamined Patent Application Publication No. 9-107203, a resonant circuit is formed of a parasitic capacitance possessed by a field effect transistor (FET) and an inductor. The resonant frequency of the resonant circuit is set to be the same as the use frequency. Thus, it can be expected that high isolation will be achieved at this use frequency.

However, the higher the isolation of the switching circuit becomes, the larger isolation deviation becomes in a certain frequency band including the use frequency. The resonant frequency varies due to variations in the inductance value or variations in the parasitic capacitance of the FET. Therefore, if the isolation deviation is large, it is possible that there will be a problem in that the isolation characteristics of a plurality of switching circuits having the same configuration will vary greatly due to variation in the resonant frequency.

Therefore, an object of the present invention is to provide a switching circuit that is not likely to be affected by the resonant frequency and that is capable of suppressing variations in isolation characteristics and to provide a high-frequency module equipped with the switching circuit.

BRIEF SUMMARY OF THE INVENTION

A switching circuit according to a certain embodiment of the present invention includes a first input/output terminal; a second input/output terminal; a third input/output terminal; a first FET having a source terminal and a drain terminal, wherein one of the source terminal and the drain terminal of the first FET is electrically connected to the first input/output terminal and another one of the source terminal and the drain terminal of the first FET is electrically connected to the second input/output terminal; a second FET having a source terminal and a drain terminal, wherein one of the source terminal and the drain terminal of the second FET is electrically connected to the first input/output terminal and another one of the source terminal and the drain terminal of the second FET is electrically connected to the third input/output terminal; and an inductor and a resistor electrically connected in series with each other between the second input/output terminal and the third input/output terminal.

It is preferable that at least one of the first FET and the second FET include a plurality of FET elements connected in series with each other between the first input/output terminal and a corresponding input/output terminal from among the second and third input/output terminals. A control terminal of each of the plurality of FET elements is configured to receive a common bias voltage.

It is preferable that all of constituent elements of the switching circuit be integrated into a semiconductor substrate. It is preferable that the inductor include a spiral inductor formed of a conductive wire coiled on a surface of the semiconductor substrate.

It is preferable that the resistor include a resistance component of the spiral inductor. It is preferable that a line width of the conductive wire be about 5 μm or less.

It is preferable that a thickness of the conductive wire be about 2 μm or less.

A high-frequency module according to another embodiment of the present invention includes the above-described switching circuit and a low-noise amplifier having an input terminal that is connected to the second input/output terminal.

It is preferable that the high-frequency module further include a power amplifier having an output terminal that is connected to the third input/output terminal.

It is preferable that the high-frequency module further include a switch element. The switch element is arranged between the input terminal of the low-noise amplifier and an output terminal of the low-noise amplifier and switches whether or not the input terminal of the low-noise amplifier is short-circuited with the output terminal of the low-noise amplifier.

According to embodiments of the present invention, it is possible to provide a switching circuit that is not likely to be affected by the resonant frequency and that is capable of suppressing variations in isolation characteristics, and to provide a high-frequency module equipped with the switching circuit.

Other features, elements, characteristics and advantages of the present invention will become more apparent from the following detailed description of the preferred embodiments of the present invention with reference to the attached drawings.

DETAILED DESCRIPTION OF THE INVENTION

Figure 1:
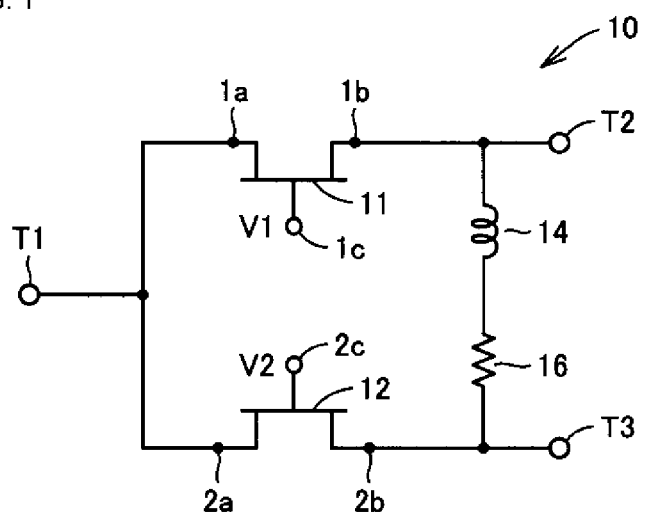
FIG. 1 is a circuit diagram illustrating a basic configuration of a switching circuit according to an embodiment of the present invention.

Hereafter, embodiments of the present invention will be described on the basis of the drawings. In the drawings referred to below, identical or corresponding parts will be denoted by the same reference symbols and the repeated description thereof will be omitted.

In this specification, the meaning of the expression "electrically connected" includes both the case where two elements are directly connected to each other and the case where two elements are connected to each other via another element. Such "elements" may be passive elements, active elements, terminals, lines and so forth but are not limited to these examples.

(Switching Circuit)

FIG. 1 is a circuit diagram illustrating the basic configuration of a switching circuit according to an embodiment of the present invention. Referring to FIG. 1, a switching circuit 10 according to the embodiment of the present invention includes a first input/output terminal T1, a second input/output terminal T2, a third input/output terminal T3, a first transistor 11, a second transistor 12, an inductor 14 and a resistor 16. In this specification, the term "input/output terminal" means a terminal that can be used as either an input terminal or an output terminal. Therefore, these terminals are not limited to being terminals with which both input and output of signal is performed.

The first transistor 11 is electrically connected between the first input/output terminal T1 and the second input/output terminal T2. The first transistor 11 has a first terminal $1a$, a second terminal $1b$ and a control terminal $1c$. The first terminal $1a$ of the first transistor 11 is electrically connected to the first input/output terminal T1. The second terminal $1b$ of the first transistor 11 is electrically connected to the second input/output terminal T2. The on state and the off state of the first transistor 11 are controlled by a control voltage V1 applied to the control terminal $1c$.

The second transistor 12 is electrically connected between the first input/output terminal T1 and the third input/output terminal T3. The second transistor 12 has a first terminal $2a$, a second terminal $2b$ and a control terminal $2c$. The first terminal $2a$ of the second transistor 12 is electrically connected to the first input/output terminal T1. The second terminal $2b$ of the second transistor 12 is electrically connected to the third input/output terminal T3. The on state and the off state of the second transistor 12 are controlled by a control voltage V2 applied to the control terminal $2c$.

Specifically, the first transistor 11 and the second transistor 12 are FETs. The first terminal $1a$ of the first transistor 11 is a source terminal of the FET and the second terminal $1b$ of the first transistor 11 is a drain terminal of the FET. Similarly, the first terminal $2a$ of the second transistor 12 is a source terminal of the FET and the second terminal $2b$ of the second transistor 12 is a drain terminal of the FET. However, the first terminals ($1a$ and $2a$) of the FETs may be drain terminals of the FETs and the second terminals ($1b$ and $2b$) of the FETs may be source terminals of the FETs.

The above-mentioned "first terminals" and "second terminals" may be alternatively referred to as "first input/output electrodes" and "second input/output electrodes", respectively. In addition, the "drain terminals" and "source terminals" may be alternatively referred to as "drain electrodes" and "source electrodes", respectively.

The inductor 14 and the resistor 16 are electrically connected in series with each other between the second input/output terminal T2 and the third input/output terminal T3. Therefore, one end of the inductor 14 is electrically connected to the second input/output terminal T2 and to the second terminal 1b of the first transistor 11. The other end of the inductor 14 is connected to one end of the resistor 16. The other end of the resistor 16 is electrically connected to the third input/output terminal T3 and to the second terminal 2b of the second transistor 12.

The switching circuit 10 illustrated in FIG. 1 is able to function as an SPDT switch. In this case, the first transistor 11 and the second transistor 12 are switched on and off in a complementarily manner.

More specifically, when the first transistor 11 is made to be in an on state, the second transistor 12 is made to be in an off state. In this case, a first transmission path is formed between the first input/output terminal T1 and the second input/output terminal T2. On the other hand, when the first transistor 11 is made to be in an off state, the second transistor 12 is made to be in an on state. In this case, a second transmission path is formed between the first input/output terminal T1 and the third input/output terminal T3.

Figure 2:
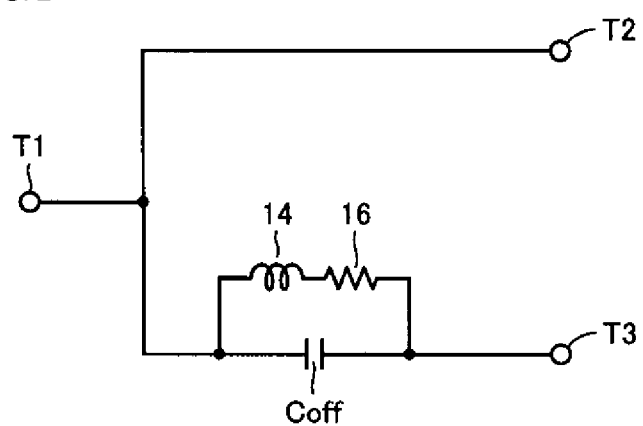
FIG. 2 is an equivalent circuit diagram illustrating a switching circuit at a time when a first transmission path is formed.

FIG. 2 is an equivalent circuit diagram illustrating the switching circuit 10 at a time when the first transmission path is formed. Referring to FIG. 2, the first transmission path is schematically illustrated as a line that connects the first input/output terminal T1 and the second input/output terminal T2. On the other hand, since the second transmission path is disconnected, the second transistor 12 is schematically represented as a capacitance Coff.

The inductor 14 and the capacitance Coff form a parallel resonant circuit. The role of the resistor 16 will be described below. The isolation of the first input/output terminal T1 and the third input/output terminal T3 from each other can be made high at the resonant frequency of the parallel resonant circuit.

The resonant frequency of the parallel resonant circuit is determined by the inductance value of the inductor 14 and the capacitance value of the capacitance Coff. Specifically, the resonant frequency is set to be a desired frequency within an operation frequency band of the switching circuit 10 (for example, the center frequency). Therefore, the switching circuit 10 is able to attain high isolation in its operation frequency band.

An equivalent circuit of the switching circuit 10 when the second transmission path is formed is the same as the circuit in the equivalent circuit diagram of FIG. 2 except that the second input/output terminal T2 and the third input/output terminal T3 are swapped. Therefore, in the case where the second transmission path is formed, the isolation of the first input/output terminal T1 and the second input/output terminal T2 from each other can be made high at the resonant frequency of the resonant circuit.

The Q value of the parallel resonant circuit formed of the inductor 14 and the capacitance Coff can be expressed as $\omega_0/(\omega_2-\omega_1)$. $\omega_0$ is the resonant frequency of the parallel resonant circuit. $\omega_1$ is a frequency at which the oscillation energy is half the peak value on the low-frequency side of the resonant frequency $\omega_0$. In addition, $\omega_2$ is a frequency at which the oscillation energy is half the peak value on the high-frequency side of the resonant frequency $\omega_0$. $(\omega_2-\omega_1)$ is referred to as half width.

If it is assumed that the resistor 16 is omitted from the parallel resonant circuit illustrated in FIG. 2, the Q value of the parallel resonant circuit becomes high. The higher the Q value becomes, the higher the isolation that can be attained at the resonant frequency.

However, as the Q value of the parallel resonant circuit increases, the half width becomes smaller. Therefore, the isolation deviation in a certain frequency band that includes the resonant frequency becomes larger. Here, "isolation deviation" may be defined as the difference between the maximum value of the isolation and the minimum value of the isolation in a certain frequency band.

The resonant frequency $\omega_0$ of the parallel resonant circuit varies due to the variation of the inductance value of the inductor 14 or the variation of the capacitance value of the capacitance Coff. Therefore, in the case where the isolation deviation is large, there is a great variation between the isolation characteristics of a plurality of switching circuits having the same configuration because of the variation in the resonant frequency.

In the embodiment of the present invention, the switching circuit 10 includes the resistor 16 that is connected in series with the inductor 14. Even though the Q value of the resonant circuit is decreased because of the resistor 16, the half width can be increased. Thus, the isolation deviation can be made small over a broad frequency band. As a result, a switching circuit with a small variation in the isolation deviation with respect to the variations in the inductance value of the inductor 14 or the variations in the capacitance value of the capacitance Coff can be realized.

Figure 3:
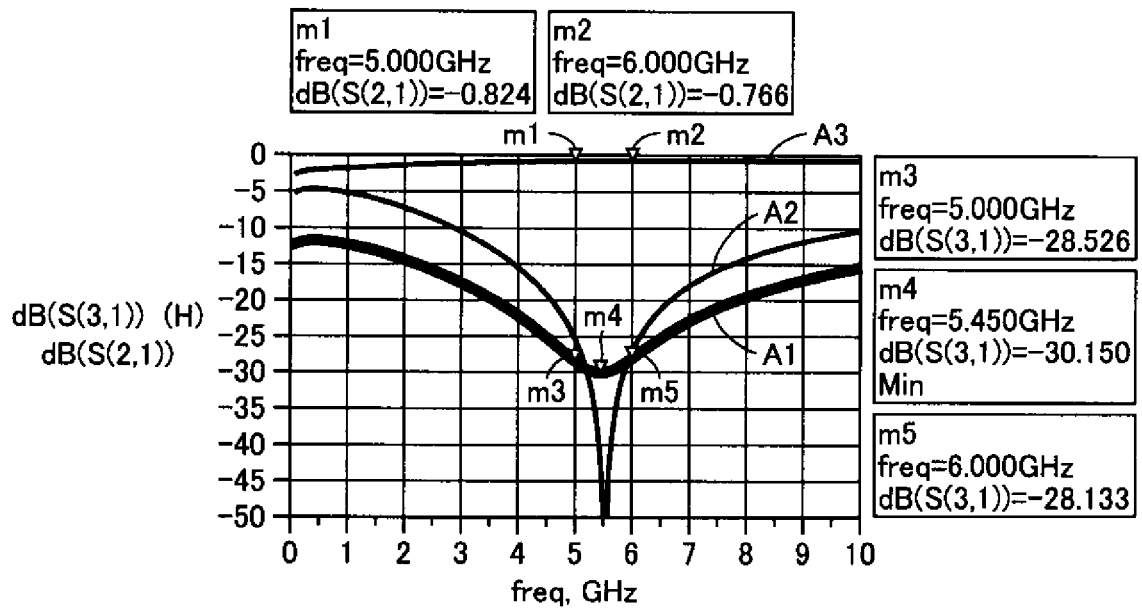
FIG. 3 is a diagram that compares the isolation characteristics of the switching circuit according to the embodiment of the present invention and the isolation characteristics of a switching circuit of the related art that utilizes a chip inductor.

FIG. 3 is a diagram that compares the isolation characteristics of the switching circuit according to the embodiment of the present invention and the isolation characteristics of a switching circuit of the related art that utilizes a chip inductor. Referring to FIG. 3, a curve A1 represents the frequency characteristics of the isolation of the first input/output terminal T1 and the third input/output terminal T3 from each other obtained by the switching circuit according to the embodiment of the present invention. A curve A2 represents the frequency characteristics of isolation of the first input/output terminal T1 and the third input/output terminal T3 from each other obtained by the switching circuit of the related art that utilizes a chip inductor. A curve A3 represents the frequency characteristics of the insertion loss in the case where a signal is transmitted from the first input/output terminal T1 to the second input/output terminal T2 along the first transmission path.

The inductance value of the inductor 14 for the curve A1 is about 10 nH, and the resistance value of the resistor 16 is about 100Ω. In addition, the inductance value of the chip inductor for the curve A2 is about 5.6 nH. The chip inductor is used in the configuration of the related art in which a resistor is omitted. The difference in the inductance value between the curve A1 and the curve A2 when the switching circuit according to the embodiment of the present invention and the switching circuit of the related art are made to resonate in the vicinity of 5.5 GHz is caused by the difference between the parasitic capacitance possessed by the spiral inductor in the embodiment of the present invention and the parasitic capacitance possessed by the chip inductor which has a helical structure.

The capacitance value of the capacitance Coff is for example around 0.0835 pF. However, these values are merely for explaining one embodiment of the present invention. In addition, the frequencies illustrated in FIG. 3 are merely for explaining one embodiment of the present invention.

A marker "m1" indicates the insertion loss of the second transmission path at a frequency of around 5 GHz. A marker "m2" indicates the insertion loss of the second transmission path at a frequency of around 6 GHz. A marker "m3" indicates the isolation of the first transmission path at a frequency of around 5 GHz. A marker "m4" indicates the isolation of the first transmission path at the resonant frequency. A marker "m5" indicates the isolation of the first transmission path at a frequency of around 6 GHz. The definitions of the curves A1 to A3 and the markers m1 to m5 are the same for the drawings referred to below and therefore the repeated description thereof will not be given hereafter.

The horizontal axis of the graph represents the frequency and the vertical axis of the graph represents the isolation and insertion loss. The larger the absolute value of a numerical value (negative value) on the vertical axis becomes, the higher the value of the represented isolation becomes.

In the case of the switching circuit of the related art that utilizes a chip inductor, the isolation becomes high at the resonant frequency (in the vicinity of 5.45 GHz), as illustrated by the curve A2. However, in the frequency range from around 5 GHz to 6 GHz, the isolation deviation is large. In contrast, in the embodiment of the present invention, the isolation deviation in the frequency range from around 5 GHz to 6 GHz is small and is on the order of 2 dB as illustrated by the curve A1. That is, according to the embodiment of the present invention, it is possible to make the isolation deviation small across a broad frequency band. In addition, according to the embodiment of the present invention, the insertion loss of the second transmission path substantially does not change in the frequency range from around 5 GHz to 6 GHz.

As described above, according to the embodiment of the present invention, for example in the case where the inductance value of the inductor varies, there is not likely to be an influence due to the resonant frequency and the variation of the isolation characteristics can be suppressed. This point will be described in detail using a specific example.

Figure 4:
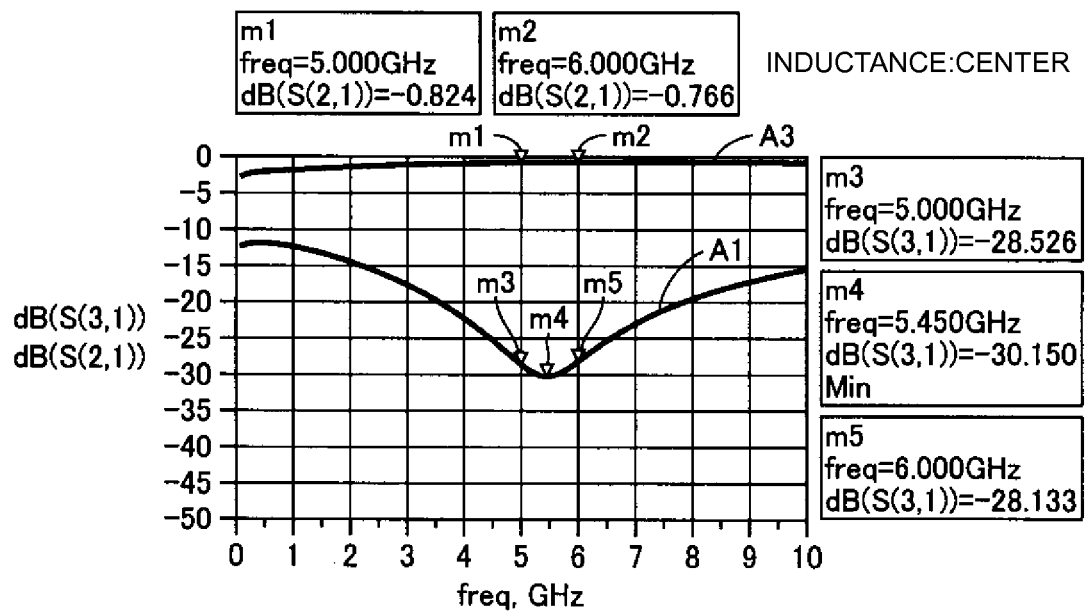
FIG. 4 illustrates the frequency characteristics of the isolation and insertion loss in the switching circuit according to the embodiment of the present invention in a case where an inductance value is about 10 nH (center).
Figure 5:
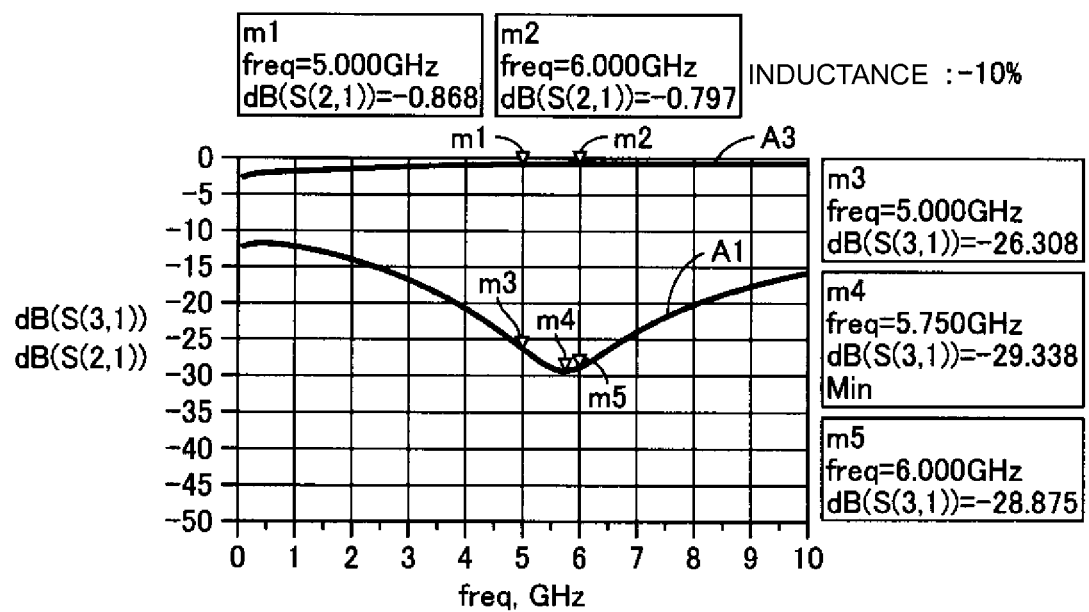
FIG. 5 illustrates the frequency characteristics of the isolation and insertion loss in the switching circuit according to the embodiment of the present invention in a case where an inductance value is about 9 nH (−10%).
Figure 6:
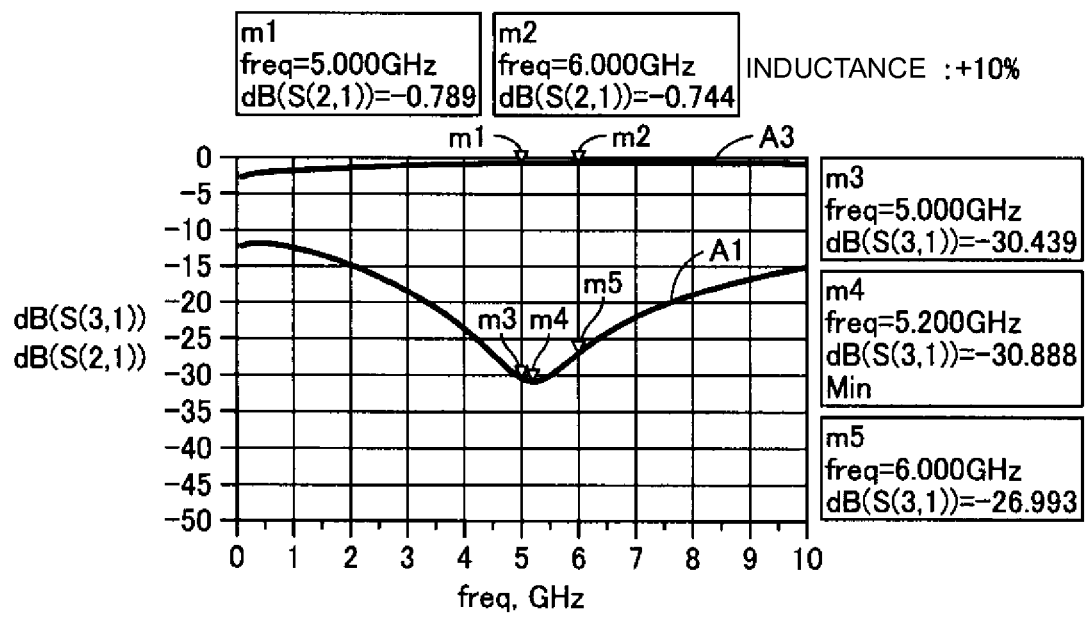
FIG. 6 illustrates the frequency characteristics of the isolation and insertion loss in the switching circuit according to the embodiment of the present invention in a case where an inductance value is about 11 nH (+10%).

FIGS. 4 to 6 are diagrams illustrating the frequency characteristics of the isolation and insertion loss in cases where the inductance value of the inductor included in the switching circuit according to the embodiment of the present invention is changed. FIG. 4 illustrates the frequency characteristics of the isolation and insertion loss in the switching circuit according to the embodiment of the present invention in a case where an inductance value is about 10 nH (center). FIG. 5 illustrates the frequency characteristics of the isolation and insertion loss in the switching circuit according to the embodiment of the present invention in a case where an inductance value is about 9 nH (−10%). FIG. 6 illustrates the frequency characteristics of the isolation and insertion loss in the switching circuit according to the embodiment of the present invention in a case where an inductance value is about 11 nH (+10%).

Referring to FIGS. 4 to 6, the isolation deviation in the frequency band of 5 GHz to 6 GHz is approximately 2.017 dB in the case where the inductance value is about 10 nH, is approximately 3.03 dB in the case where the inductance value is about 9 nH, and is approximately 3.895 dB in the case where the inductance value is about 11 nH.

Figure 7:
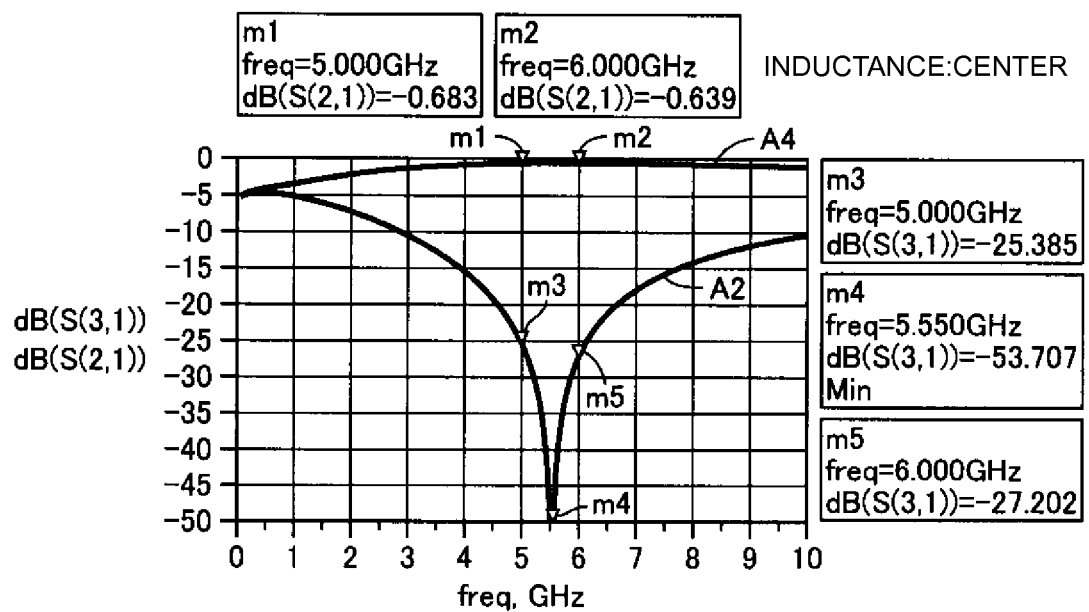
FIG. 7 illustrates the frequency characteristics of the isolation and insertion loss in the switching circuit of the related art that utilizes a chip inductor in a case where an inductance value is about 5.6 nH (center).
Figure 8:
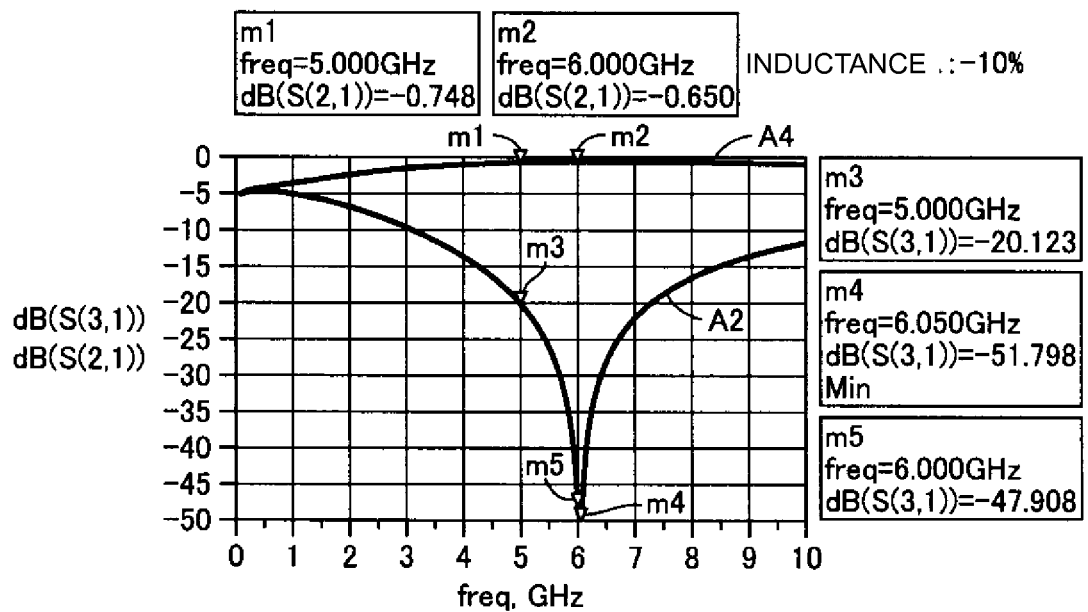
FIG. 8 illustrates the frequency characteristics of the isolation and insertion loss in the switching circuit of the related art that utilizes a chip inductor in a case where an inductance value is about 5.1 nH (−10%).
Figure 9:
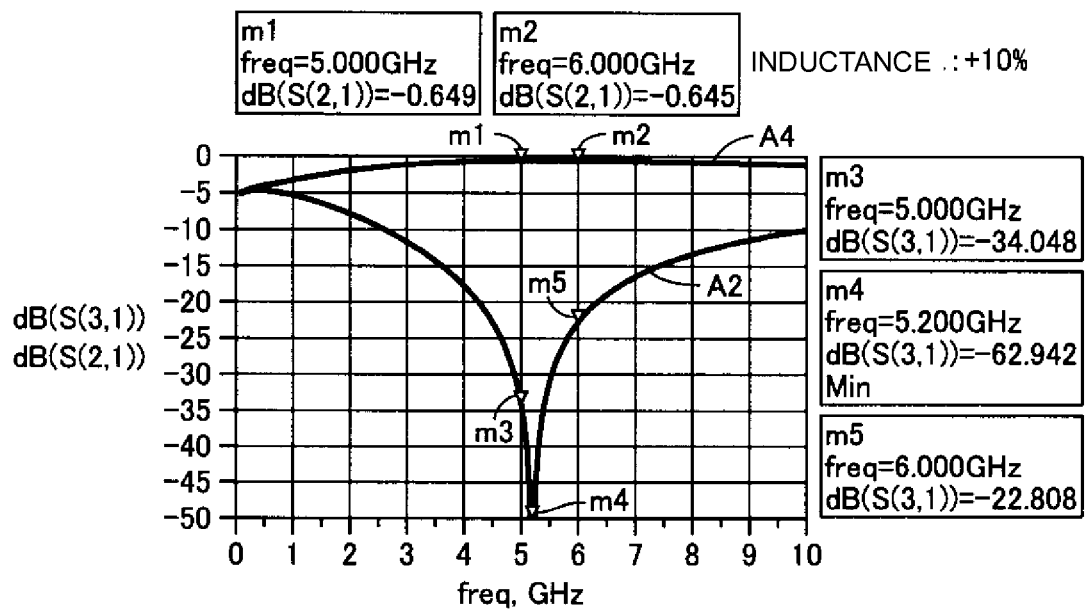
FIG. 9 illustrates the frequency characteristics of the isolation and insertion loss in the switching circuit of the related art that utilizes a chip inductor in a case where an inductance value is about 6.2 nH (+10%).

FIGS. 7 to 9 illustrate the frequency characteristics of the isolation and insertion loss in the switching circuit of the related art that utilizes a chip inductor in cases where an inductance value of the inductor is changed. FIG. 7 illustrates the frequency characteristics of the isolation and insertion loss in the switching circuit of the related art that utilizes a chip inductor in a case where an inductance value is about 5.6 nH (center). FIG. 8 illustrates the frequency characteristics of the isolation and insertion loss in the switching circuit of the related art that utilizes a chip inductor in a case where an inductance value is about 5.1 nH (−10%). FIG. 9 illustrates the frequency characteristics of the isolation and insertion loss in the switching circuit of the related art that utilizes a chip inductor in a case where an inductance value is about 6.2 nH (+10%).

A chip inductor was used as the inductor. Since the capacitance of the chip inductor is large and the range of the resonant frequency is around 5 GHz to 6 GHz, the inductance values were smaller than in the cases illustrated in FIGS. 4 to 6. The fact that the inductance values illustrated in FIGS. 7 to 9 are smaller than in the cases illustrated in FIGS. 4 to 6 is due to the difference between the parasitic capacitance possessed by the spiral inductor in the embodiment of the present invention and the parasitic capacitance possessed by the chip inductor having a helical structure.

Referring to FIGS. 7 to 9, the curve A2 represents the frequency characteristics of the isolation of the second transmission path and the curve A4 represents the frequency characteristics of the insertion loss of the first transmission path. The isolation deviation in the frequency band of around 5 GHz to 6 GHz is approximately 28.322 dB in the case where the inductance value is about 5.6 nH, is approximately 27.785 dB in the case where the inductance value is about 5.1 nH, and is approximately 40.134 dB in the case where the inductance value is about 6.2 nH.

As illustrated in FIGS. 4 to 9, according to the embodiment of the present invention, the isolation deviation can be decreased using the resistor 16 even in the case where the impedance value varies.

Figure 10:
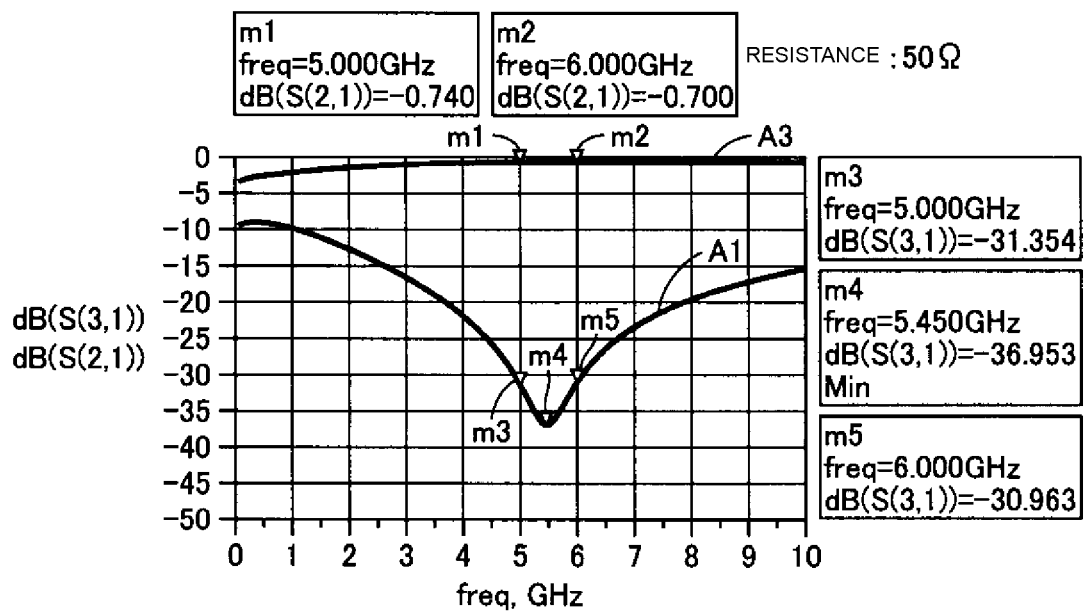
FIG. 10 illustrates the frequency characteristics of the isolation and insertion loss in the switching circuit according to the embodiment of the present invention in a case where a resistance value is about 50Ω.
Figure 11:
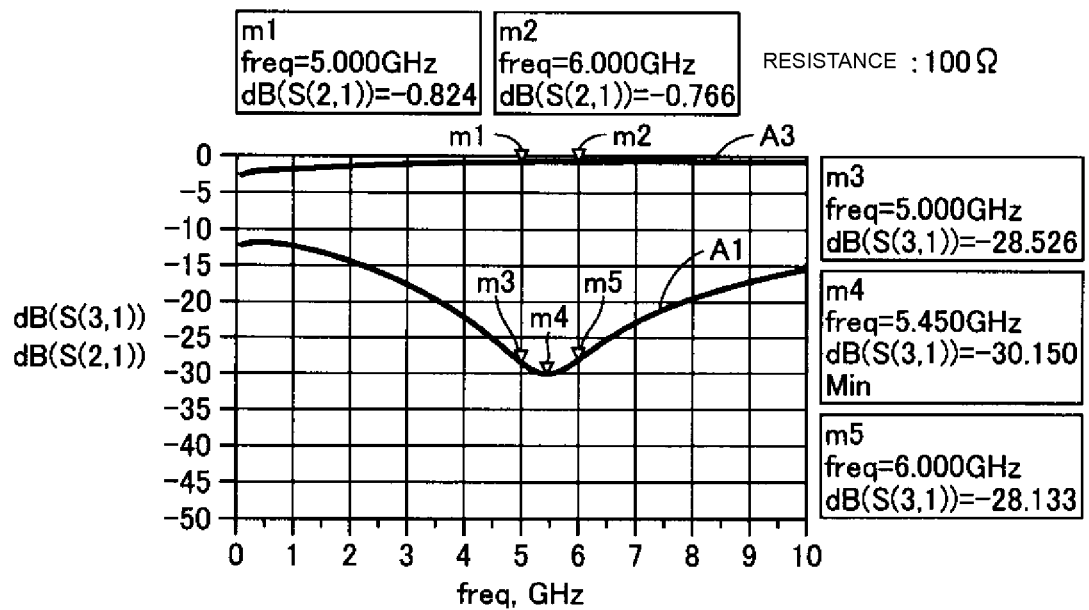
FIG. 11 illustrates the frequency characteristics of the isolation and insertion loss in the switching circuit according to the embodiment of the present invention in a case where a resistance value is about 100Ω.
Figure 12:
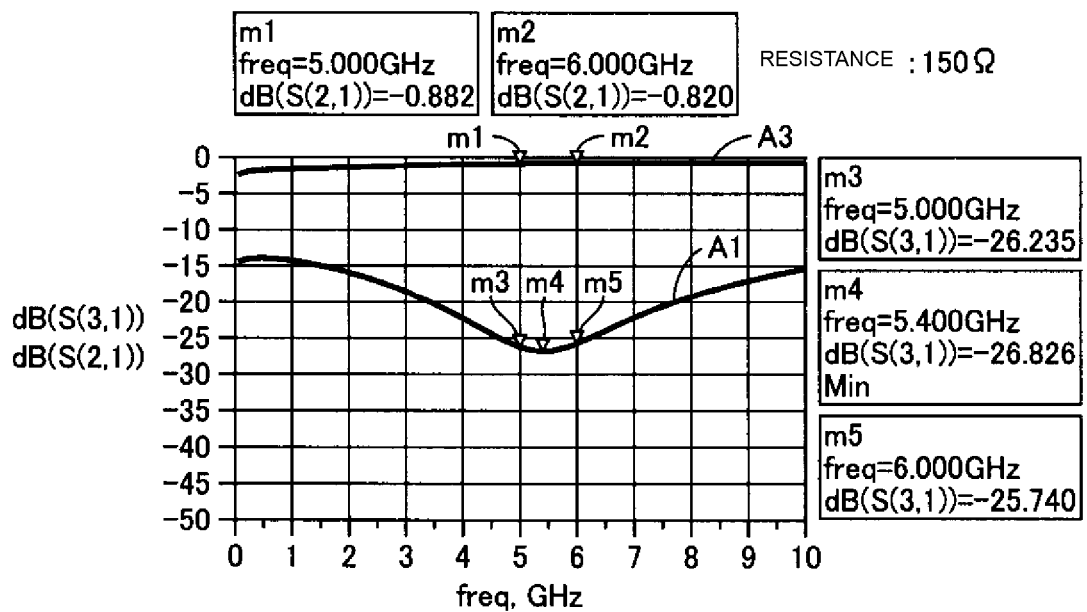
FIG. 12 illustrates the frequency characteristics of the isolation and insertion loss in the switching circuit according to the embodiment of the present invention in a case where a resistance value is about 150Ω.
Figure 13:
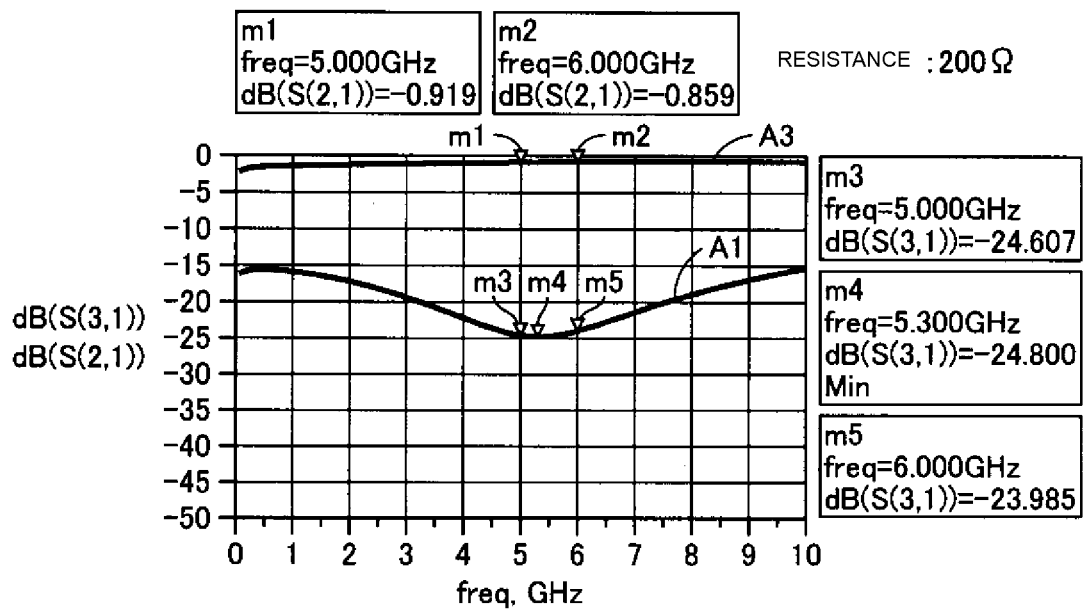
FIG. 13 illustrates the frequency characteristics of the isolation and insertion loss in the switching circuit according to the embodiment of the present invention in a case where a resistance value is about 200Ω.
Figure 14:
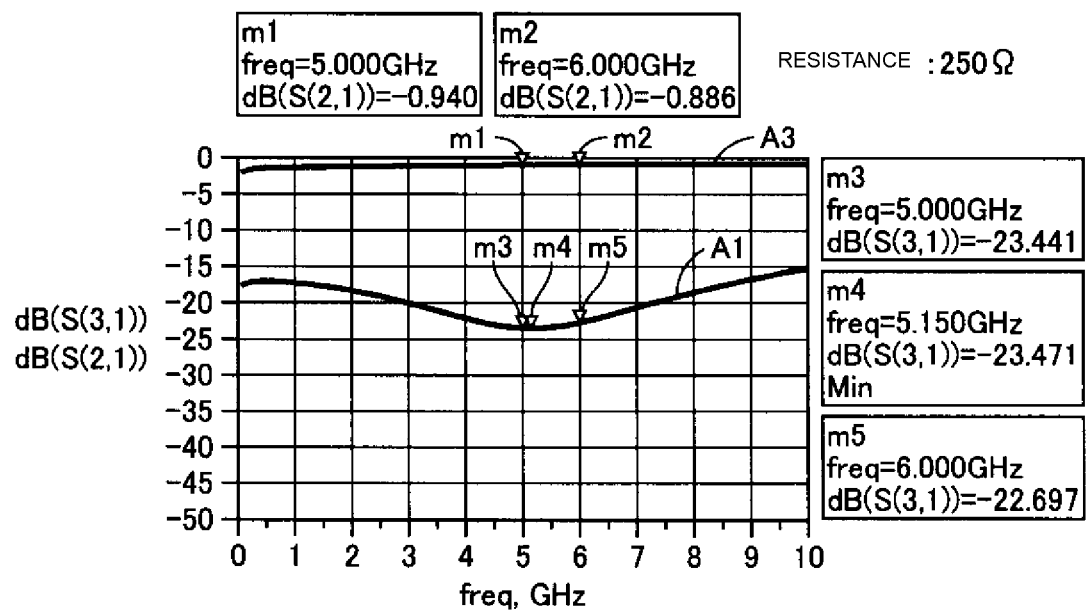
FIG. 14 illustrates the frequency characteristics of the isolation and insertion loss in the switching circuit according to the embodiment of the present invention in a case where a resistance value is about 250Ω.

FIGS. 10 to 14 illustrate the frequency characteristics of the isolation and insertion loss in the switching circuit according to the embodiment of the present invention in cases where the resistance value of the resistor 16 is changed. FIG. 10 illustrates the frequency characteristics of the isolation and insertion loss in the switching circuit according to the embodiment of the present invention in a case where a resistance value is about 50Ω. FIG. 11 illustrates the frequency characteristics of the isolation and insertion loss in the switching circuit according to the embodiment of the present invention in a case where a resistance value is 100Ω. FIG. 12 illustrates the frequency characteristics of the isolation and insertion loss in the switching circuit according to the embodiment of the present invention in a case where a resistance value is about 150Ω. FIG. 13 illustrates the frequency characteristics of the isolation and insertion loss in the switching circuit according to the embodiment of the present invention in a case where a resistance value is about 200Ω. FIG. 14 illustrates the frequency characteristics of the isolation and insertion loss in the switching circuit according to the embodiment of the present invention in a case where a resistance value is about 250Ω.

Referring to FIGS. 10 to 14, the larger the resistance value, the more the isolation is decreased, and the smaller the isolation deviation becomes. On the other hand, in the case where the resistance value is changed, the difference between the insertion loss at a frequency of around 5 GHz and the insertion loss at a frequency of around 6 GHz does not change greatly. Therefore, as illustrated in FIGS. 10 to 14, the resistance value of the resistor 16 can be appropriately set in accordance with the isolation and isolation deviation that are required in the switching circuit 10.

In the circuit illustrated in FIG. 1, the first transistor 11 and the second transistor 12 are each formed of a single transistor. However, the configuration of the switching circuit 10 according to the embodiment of the present invention is not limited to this configuration. For example, as will be described below, at least one of the first transistor 11 and the second transistor 12 may include a plurality of multistage-connected transistor elements.

The plurality of transistor elements are electrically connected in series with each other between the first input/output terminal T1 and a corresponding input/output terminal from among the second input/output terminal T2 and the third input/output terminal T3. In addition, each of the plurality of multistage-connected transistor elements is configured to receive a common control voltage via a control terminal thereof. The electric power handling capability of the switching circuit can be improved by using a plurality of multistage-connected transistor elements. The number of the plurality of multistage-connected transistor elements is not particularly limited so long as it is two or more.

Figure 15:
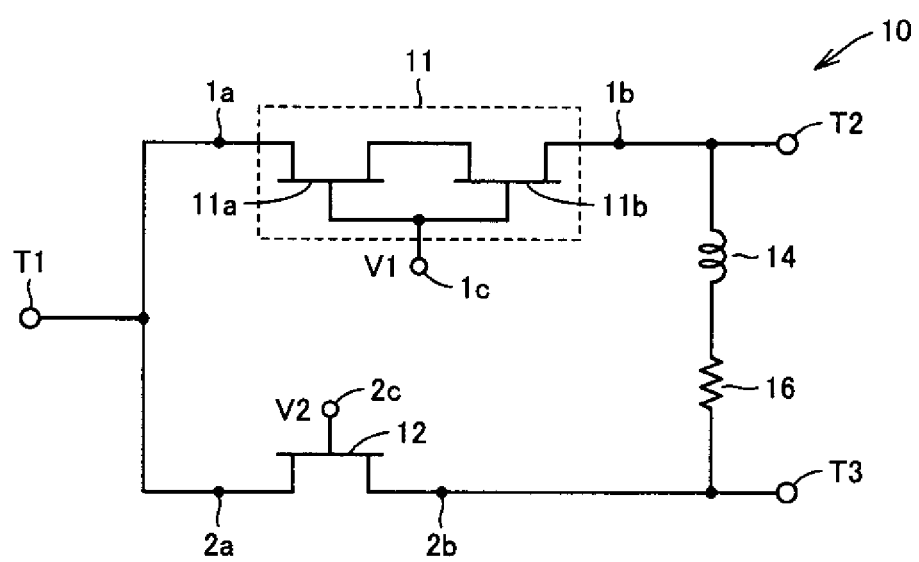
FIG. 15 illustrates a first example of a preferable configuration of the switching circuit according to the embodiment of the present invention.

FIG. 15 illustrates a first example of a preferable configuration of the switching circuit 10 according to the embodiment of the present invention. Referring to FIG. 15, the first transistor 11 includes a transistor element 11a and a transistor element 11b that are connected in series with each other. The transistor elements 11a and 11b are FETs. A control terminal of the transistor element 11a and a control terminal of the transistor element 11b are connected to each other and form the control terminal 1c. Therefore, each of the transistor elements 11a and 11b receives a common control voltage V1 on the control terminal (gate) thereof.

Figure 16:
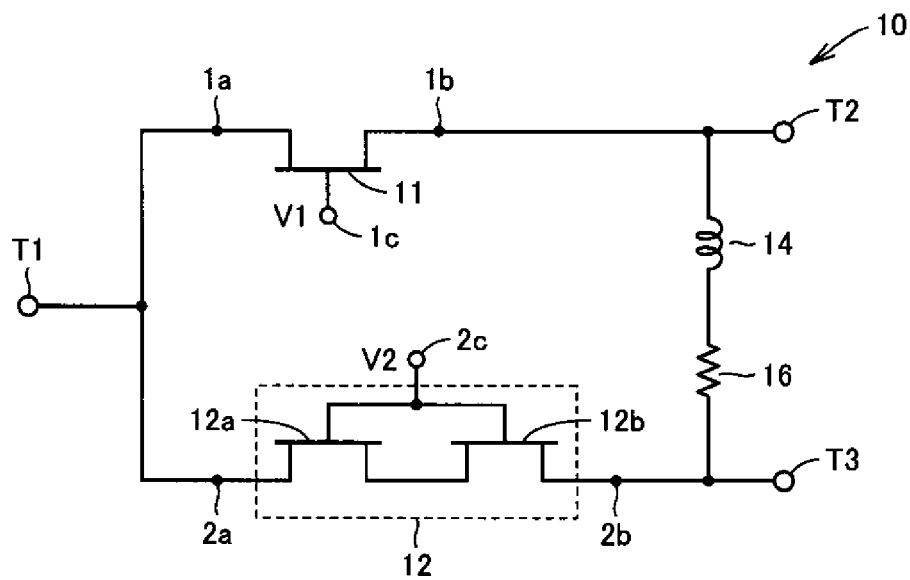
FIG. 16 illustrates a second example of a more preferable configuration of the switching circuit according to the embodiment of the present invention.

FIG. 16 illustrates a second example of a more preferable configuration of the switching circuit 10 according to the embodiment of the present invention. Referring to FIG. 16, the second transistor 12 includes a transistor element 12a and a transistor element 12b that are connected in series with each other. The transistor elements 12a and 12b are FETs. A control terminal of the transistor element 12a and a control terminal of the transistor element 12b are connected to each other and form the control terminal 2c. Therefore, each of the transistor elements 12a and 12b receives a common control voltage V2 on the control terminal (gate electrode) thereof.

Figure 17:
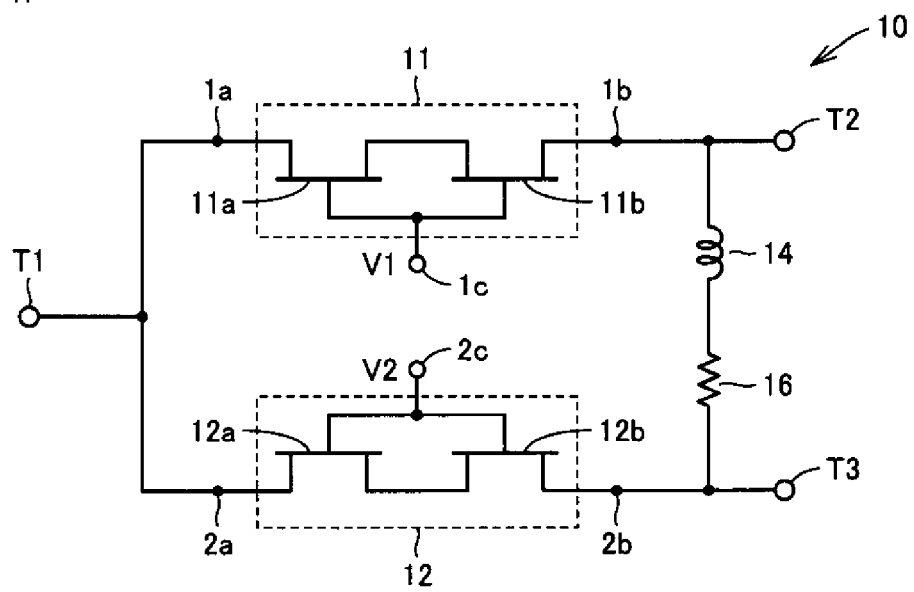
FIG. 17 illustrates a third example of a more preferable configuration of the switching circuit according to the embodiment of the present invention.

FIG. 17 illustrates a third example of a more preferable configuration of the switching circuit 10 according to the embodiment of the present invention. Referring to FIG. 17, the first transistor 11 includes a transistor element 11a and a transistor element 11b that are connected in series with each other. In addition, the second transistor 12 includes a transistor element 12a and a transistor element 12b that are connected in series with each other. The configuration of the first transistor 11 and the configuration of the second transistor 12 are the same as those illustrated in FIG. 15 and FIG. 16, and therefore the repeated description thereof will not be given below.

Figure 18:
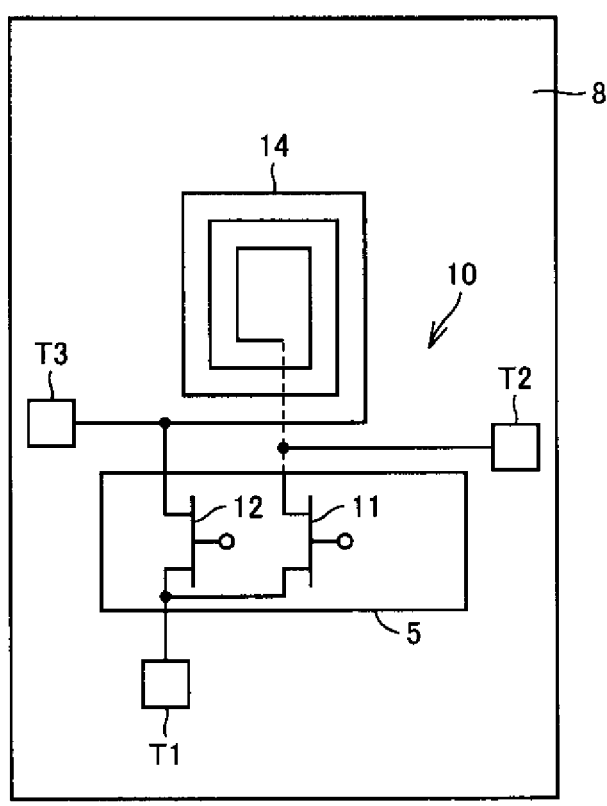
FIG. 18 illustrates a first actual example of the switching circuit according to the embodiment of the present invention.

FIG. 18 illustrates a first actual example of the switching circuit 10 according to the embodiment of the present invention. Referring to FIG. 18, all of the elements of the switching circuit 10 are integrated into a semiconductor substrate 8. Specifically, a semiconductor substrate 8 has a transistor region 5 in which the first transistor 11 and the second transistor 12 are formed. The first input/output terminal T1, the second input/output terminal T2 and the third input/output terminal T3 are for example realized using pads that are formed on a surface of the semiconductor substrate 8.

The inductor 14 is a spiral inductor that is formed by arranging a conductive wire (line) in a spiral shape on the surface of the semiconductor substrate 8. By integrating the first transistor 11, the second transistor 12 and the inductor 14 into the semiconductor substrate 8, the lengths of wiring lines are shortened and therefore a phase difference generated between the transmission paths of the switching circuit 10 can be made smaller. In addition, generally, a spiral inductor tends to have a smaller parasitic capacitance than a chip inductor having a helical structure. The switching circuit can be reduced in size by integrating the first transistor 11, the second transistor 12 and the inductor 14 into the semiconductor substrate 8.

According to one embodiment, the semiconductor substrate 8 is a compound semiconductor (for example, gallium arsenide (GaAs) or silicon germanium (SiGe)) substrate. However, the semiconductor substrate 8 may instead be a silicon (Si) substrate. In addition, FIG. 18 illustrates the constituent elements of the switching circuit 10 in a simplified manner. Therefore, the arrangement of the constituent elements of the switching circuit 10 is not limited to the arrangement illustrated in FIG. 18.

Figure 19:
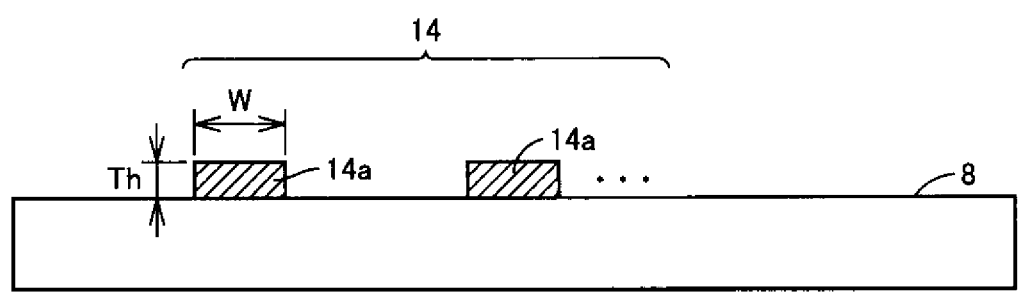
FIG. 19 is a diagram for explaining the dimensions of an inductor illustrated in FIG. 18.

FIG. 19 is a diagram for explaining the dimensions of the inductor 14 illustrated in FIG. 18. Referring to FIG. 19, the inductor 14 is formed of a line 14a that is composed of a conductive material (for example, gold (Au)). In this embodiment, a line width W of the line 14a (conductive wire) is about 5 μm or less and a thickness Th of the line 14a is about 2 μm or less.

The miniaturization of the inductor 14 can be realized by making the line width W of the line 14a equal to or less than about 5 μm. In addition, the capacitances generated between the portions of the line 14a of the inductor 14 can be reduced by making the thickness Th of the line 14a equal to or less than about 2 μm.

The inductor 14 is a spiral inductor and therefore the inner peripheral portions of the line 14a and the outer peripheral portions of the line 14a face each other. Parasitic capacitances are formed by such a pair of the facing portions. The smaller the thickness of the wiring line, the smaller the area of the facing portions can be made. In this way, the parasitic capacitance of the inductor 14 (spiral inductor) can be made small. Therefore, the capacitive coupling generated in the coiled line of the spiral inductor can be made small.

Figure 20:
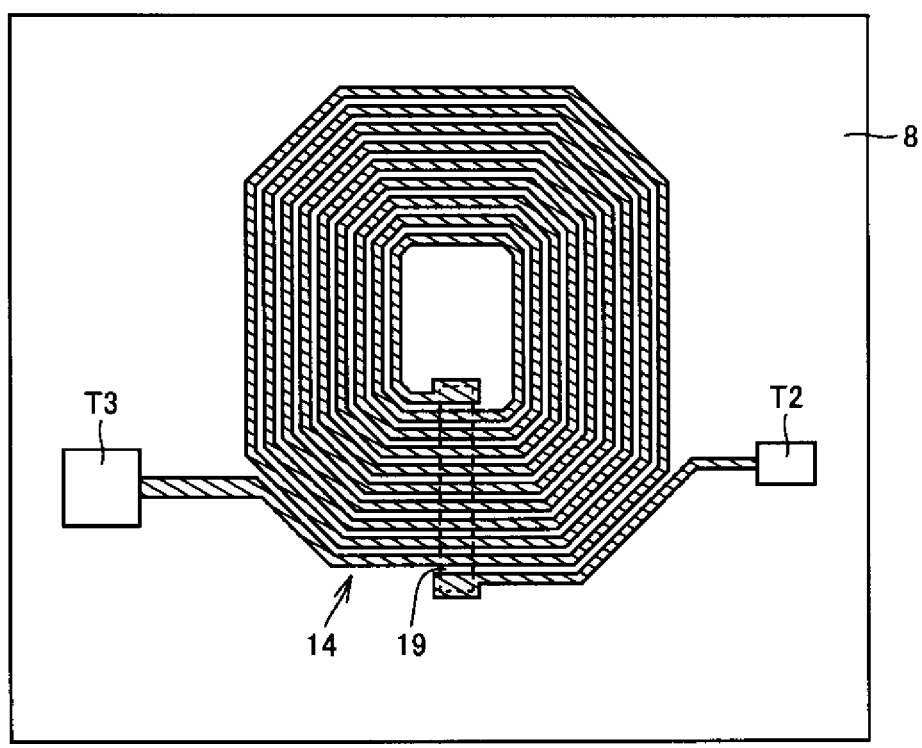
FIG. 20 is a first plan view schematically illustrating the inductor.

FIG. 20 is a first plan view schematically illustrating the inductor 14. Referring to FIG. 20, a jumper 19 is arranged in order to connect an inner peripheral end portion of the inductor 14 to for example the second input/output terminal T2 (refer to FIG. 18). An outer peripheral end portion of the inductor 14 is connected to for example the third input/output terminal T3 (refer to FIG. 18). With this configuration, the resistor 16 can be realized by the resistance component of the inductor 14. Therefore, it is possible to reduce the size of the switching circuit 10 since the planar layout can be made more compact. In order to make description of the inductor 14 easier to understand, in FIG. 20, the transistor region 5 is not illustrated (also in FIG. 21).

Figure 21:
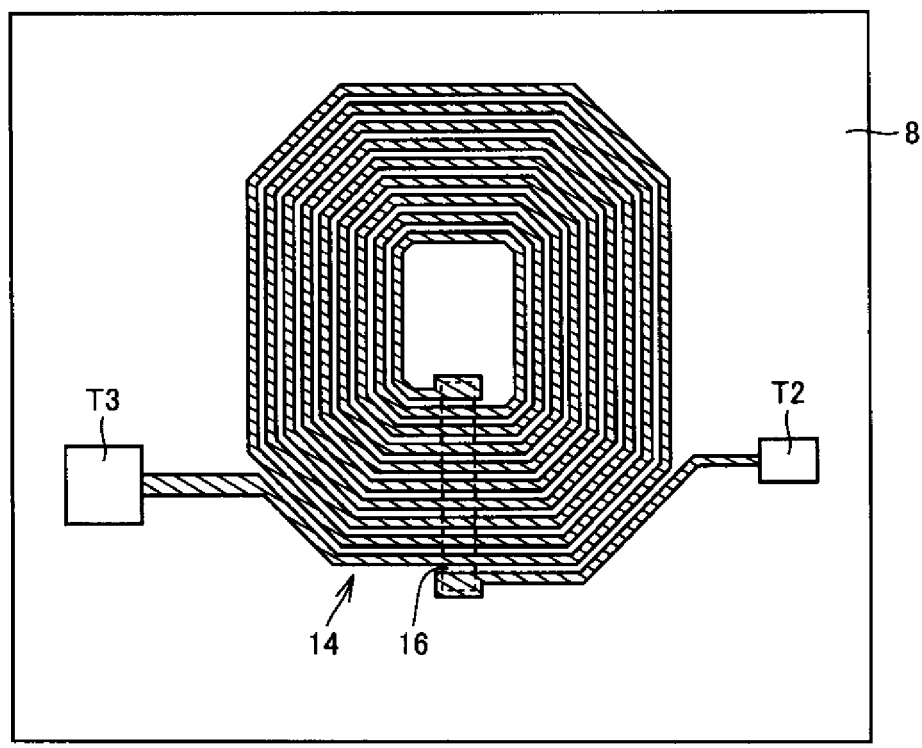
FIG. 21 is a second plan view schematically illustrating the inductor.

FIG. 21 is a second plan view schematically illustrating the inductor 14. As illustrated in FIG. 21, in order to realize a desired resistance value, the resistor 16 may be realized not only with the resistance component of the inductor 14 but also with a resistor connected to the inductor 14. The resistor 16 may be for example formed in the semiconductor substrate 8 or may be formed on the surface of the semiconductor substrate 8. In addition, a jumper (lead out line) for connecting the inner peripheral end portion of the inductor 14 to the second input/output terminal T2 may be used as the resistor 16.

(High-Frequency Module)

Figure 22:
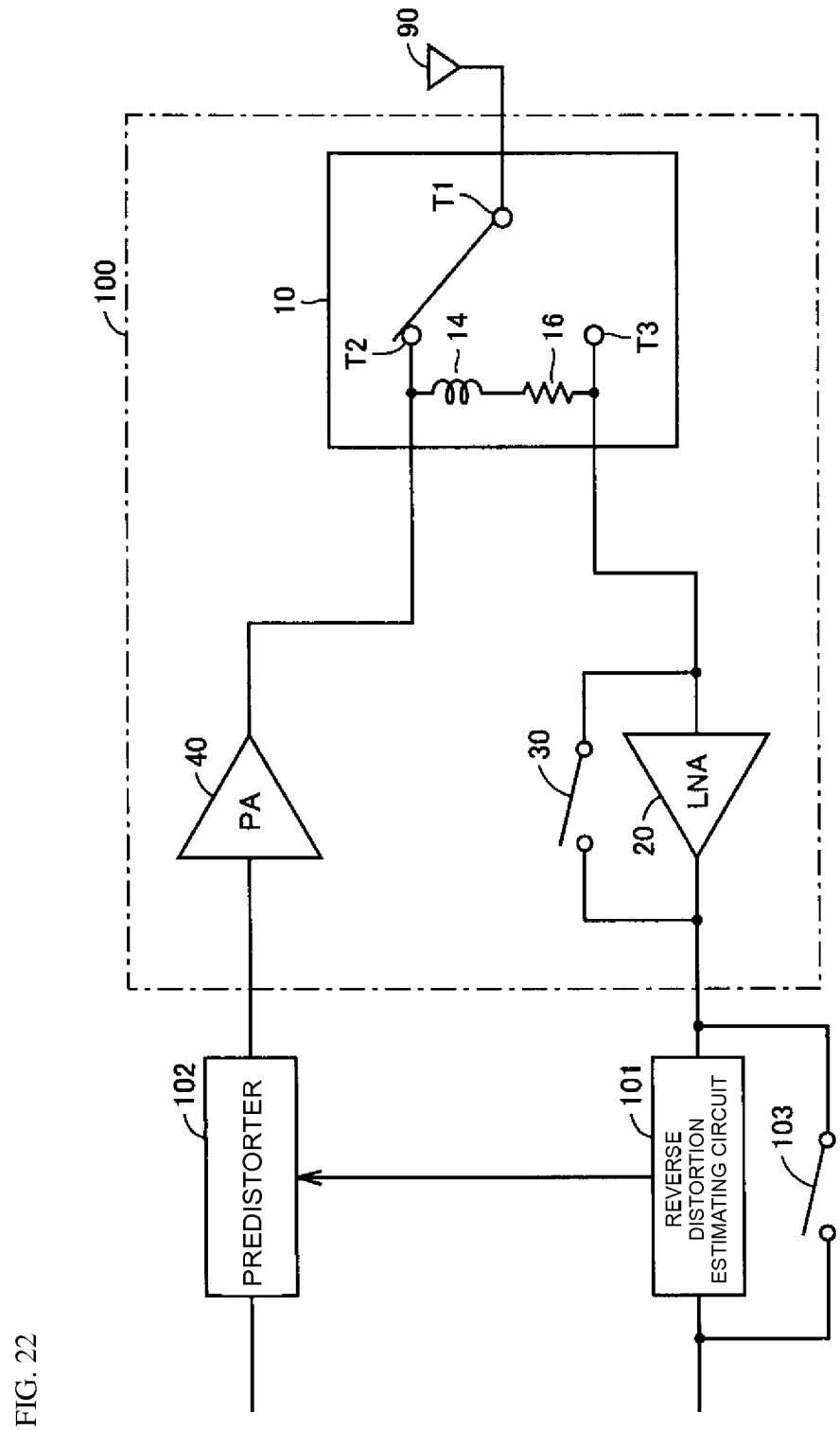
FIG. 22 illustrates an example configuration of a high-frequency module equipped with the switching circuit according to the embodiment of the present invention.

FIG. 22 illustrates an example configuration of a high-frequency module 100 equipped with the switching circuit 10 according to the embodiment of the present invention.

Referring to FIG. 22, the high-frequency module 100 is realized as a front end circuit for wireless communication. As illustrated in FIG. 22, for example, the high-frequency module 100 has a configuration compatible with a technology known as digital pre-distortion (hereafter, also referred to as "DPD").

Specifically, the high-frequency module 100 includes the switching circuit 10, a low-noise amplifier (LNA) 20, a switch element 30 and a power amplifier (PA) 40. The first input/output terminal T1 of the switching circuit 10 is connected to an antenna 90. The second input/output terminal T2 of the switching circuit 10 is connected to an output terminal of the PA 40. The third input/output terminal T3 of the switching circuit 10 is connected to an input terminal of the LNA 20.

The switch element 30 switches whether or not the input terminal of the LNA 20 is short-circuited with an output terminal of the LNA 20. In other words, the switch element 30 forms a path that allows a signal from the third input/output terminal T3 to bypass the LNA 20.

In addition to the switching circuit 10, the LNA 20, the switch element 30 and the PA 40 may be integrated into the same semiconductor substrate. Alternatively, the high-frequency module 100 may be realized with a plurality of semiconductor chips. With this configuration, the switching circuit 10 and the LNA 20 are formed so as to be integrated with each other. Thus, a parasitic component (capacitance component or resistance component) generated by a connection portion between the switching circuit 10 and the LNA 20 can be reduced. Therefore, loss can be reduced.

In addition, the switching circuit 10 and the PA 40 are formed so as to be integrated with each other. Thus, a parasitic component (capacitance component or resistance component) generated by a connection portion between the switching circuit 10 and the PA 40 can be reduced. Therefore, the loss can be reduced.

The output terminal of the LNA 20 is connected to a reverse distortion estimating circuit 101. An input terminal of the PA 40 is connected to a predistorter 102.

Figure 23:
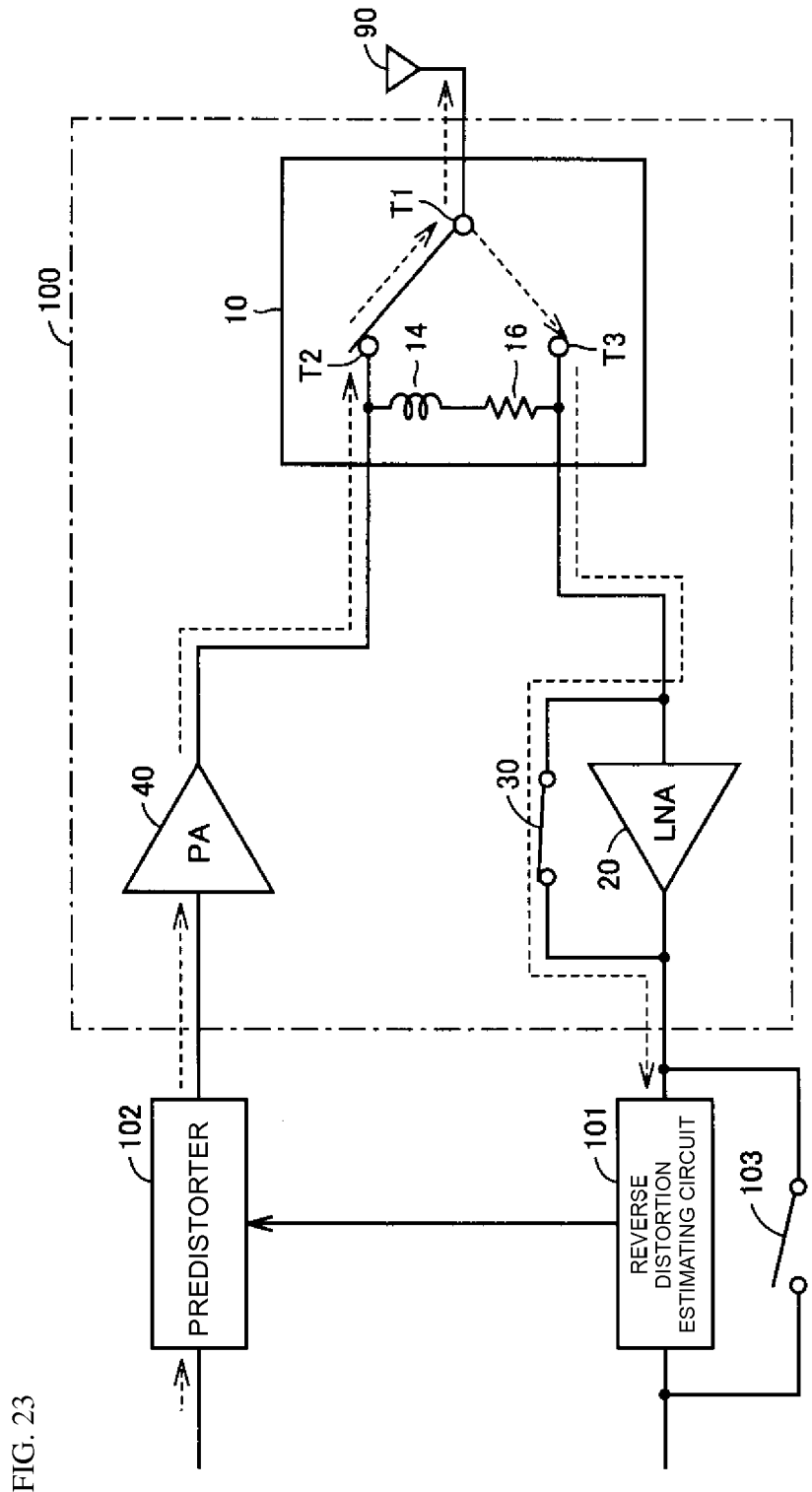
FIG. 23 is a diagram for explaining an operation when a signal is transmitted from the high-frequency module illustrated in FIG. 22.

FIG. 23 is a diagram for explaining an operation when a signal is transmitted from the high-frequency module 100 illustrated in FIG. 22. Referring to FIG. 22, the switching circuit 10 operates such that a transmission path is formed between the first input/output terminal T1 and the second input/output terminal T2.

The PA 40 amplifies a signal input thereto and outputs the amplified signal. The signal output from the PA 40 is transmitted to the first input/output terminal T1 of the switching circuit 10 along the first transmission path from the second input/output terminal T2 of the switching circuit 10. The antenna 90 outputs the signal transmitted to the first input/output terminal T1 of the switching circuit 10 in the form of radio waves.

Generally, high power efficiency and high linearity are demanded in a power amplifier. On the other hand, there is a trade-off relationship between the power efficiency and the linearity of the power amplifier. Therefore, in the case where a signal is amplified using a power amplifier that has a low linearity in order to reduce the power consumption, there is a possibility that the communication quality will be reduced or that the interference that will act on another communication system will be generated by the nonlinear distortions of the power amplifier.

One technology for increasing the efficiency to solve this problem is the above-described DPD. Since there is a limit to the level of the isolation that can be achieved in the switching circuit 10, a part of a signal transmitted to the switching circuit 10 from the PA 40 will leak into the second transmission path. This leakage signal is used as a feedback signal for estimating the reverse distortion.

The switch element 30 is switched on and as a result the signal that is leaked into the second transmission path bypasses the LNA 20. In addition, a bypass switch 103 is turned off and therefore the signal that bypasses the LNA 20 is input to the reverse distortion estimating circuit 101. The reverse distortion estimating circuit 101 generates a signal that is distorted in a direction that is opposite to that of the distortion generated in the input signal. The predistorter 102 combines the input signal and the signal generated by the reverse distortion estimating circuit 101 and outputs the combined signal to the PA 40. By using DPD, an increase in the power consumption can be suppressed and a transmission signal with the reduced distortion can be obtained.

In order to realize DPD, it is required that a suitably large signal leak into the second transmission path in the switching circuit 10. That is, it is necessary that the switching circuit 10 has suitable isolation characteristics. In the case of the isolation characteristics represented by curve A2 in FIG. 3, there is a large isolation deviation inside a frequency band (for example, around 5 GHz to 6 GHz). Therefore, when the frequency of a signal output from the power amplifier changes, there is a possibility that the magnitude of the signal that leaks into the second transmission path will greatly change.

In contrast, according to the embodiment of the present invention, the switching circuit 10 is able to make the isolation deviation small across a broad frequency band. Thus, the strength of a leakage signal input to the reverse distortion estimating circuit 101 can be stabilized across the frequency band. Stabilizing the strength of the signal input to the reverse distortion estimating circuit 101 is advantageous in estimating the reverse distortion. Therefore, according to the embodiment of the present invention, an excellent high-frequency circuit can be provided through the use of DPD.

Figure 24:
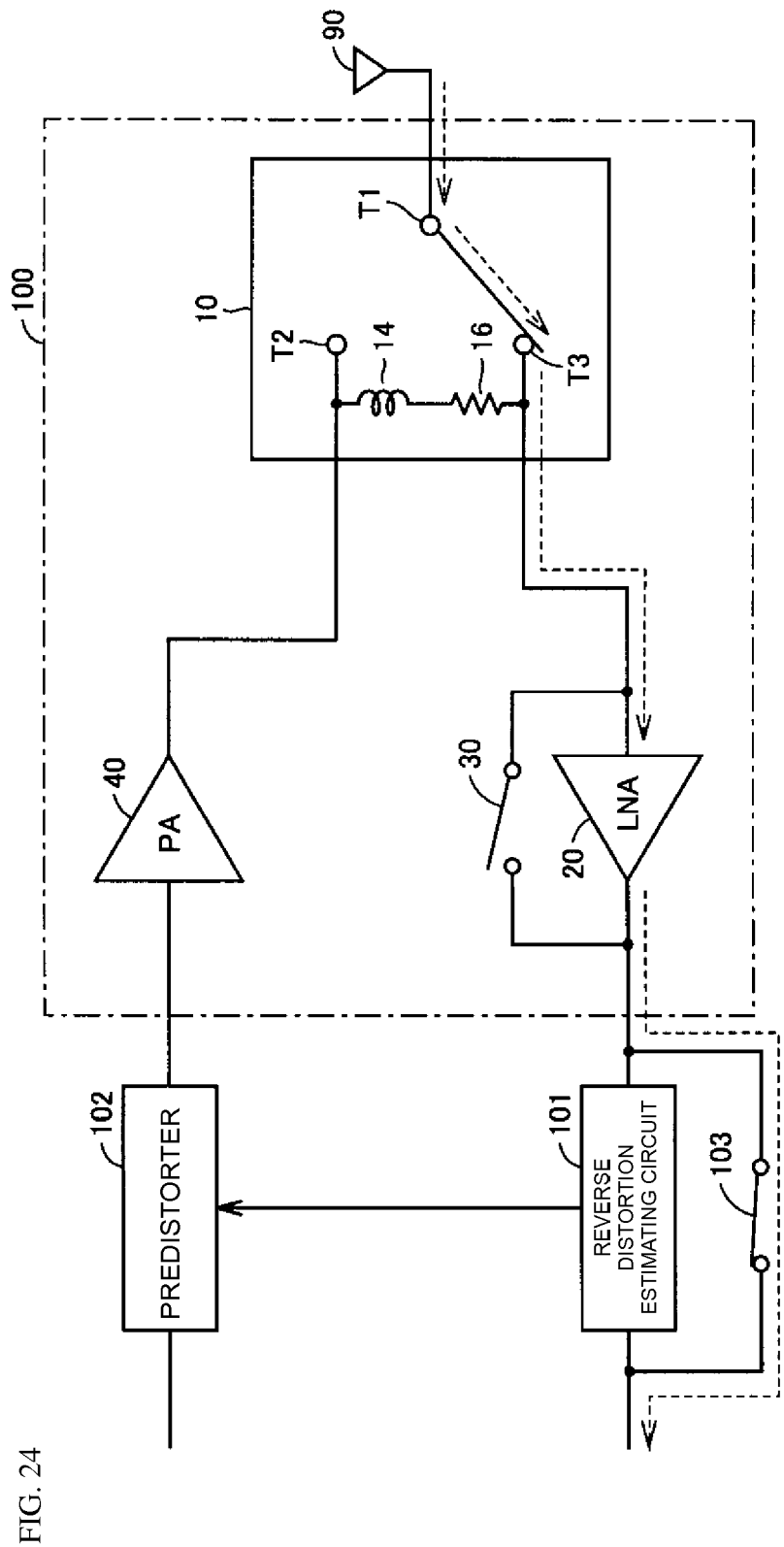
FIG. 24 is a diagram for explaining an operation when a signal is received by the high-frequency module illustrated in FIG. 22.

FIG. 24 is a diagram for explaining an operation when a signal is received by the high-frequency module 100 illustrated in FIG. 22. Referring to FIG. 24, a reception operation of the high-frequency module 100 will be described. The switching circuit 10 is switched so that the second transmission path is formed between the first input/output terminal T1 and the third input/output terminal T3. When the antenna 90 receives a signal, the signal is transmitted from the first input/output terminal T1 to the third input/output terminal T3 via the second transmission path.

In the case where the strength of the signal received by the antenna 90 is small, the reception signal is amplified by the LNA 20. In this case, the switch element 30 is switched off. On the other hand, in the case where the strength of the signal received by the antenna 90 is large, the LNA 20 is switched off and the switch element 30 is switched on. Therefore, the signal bypasses the LNA 20. When a signal is received by the high-frequency module 100, the bypass switch 103 is switched on. Thus, the signal received by the high-frequency module 100 bypasses the reverse distortion estimating circuit 101 and therefore does not pass through the reverse distortion estimating circuit 101.

Figure 25:
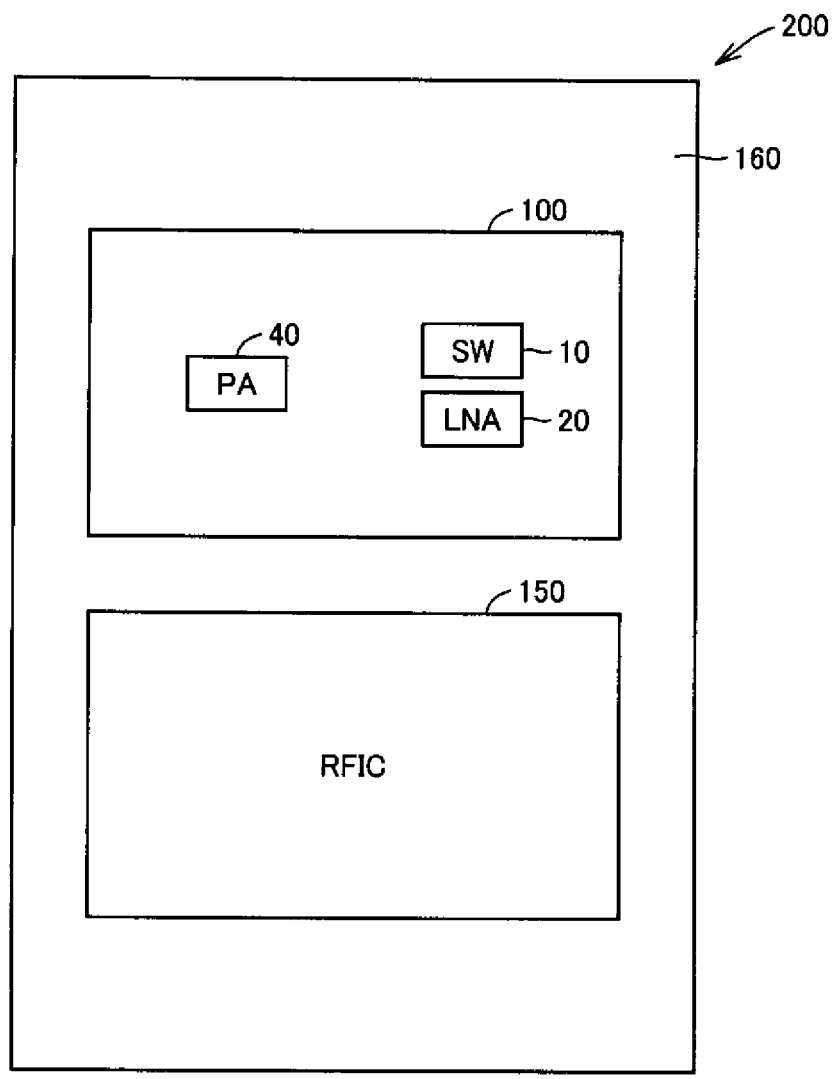
FIG. 25 is a schematic diagram illustrating a configuration of a high-frequency circuit that includes the high-frequency module illustrated in FIG. 22.

FIG. 25 is a schematic diagram illustrating a configuration of a high-frequency circuit 200 that includes the high-frequency module 100 illustrated in FIG. 22. Referring to FIG. 25, the high-frequency circuit 200 includes the high-frequency module 100, a radio frequency integrated circuit (RFIC) 150 and a substrate 160. The high-frequency module 100 and the RFIC 150 are mounted on the substrate 160.

The high-frequency module 100 includes the switching circuit (SW) 10, the LNA 20, the switch element 30 (not illustrated in FIG. 25) and the PA 40. The RFIC 150 controls the high-frequency module 100. The RFIC 150 may include the reverse distortion estimating circuit 101, the predistorter 102 and the bypass switch 103 (refer to FIG. 22). With this configuration, a high-frequency circuit that is suitable for DPD can be provided.

The presently disclosed embodiments are illustrative in all points and should be not be considered as restrictive. The scope of the present invention is not defined by the above description but rather by the scope of the claims and it is intended that equivalents to the scope of the claims and all modifications within the scope of the claims be included within the scope of the present invention.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A switching circuit comprising:
   a first input/output terminal;
   a second input/output terminal;
   a third input/output terminal;
   a first FET having a source terminal and a drain terminal, wherein one of the source terminal and the drain terminal of the first FET is electrically connected to the first input/output terminal and another one of the source terminal and the drain terminal of the first FET is electrically connected to the second input/output terminal;
   a second FET having a source terminal and a drain terminal, wherein one of the source terminal and the drain terminal of the second FET is electrically connected to the first input/output terminal and another one of the source terminal and the drain terminal of the second FET is electrically connected to the third input/output terminal; and
   an inductor and a resistor electrically connected in series with each other between the second input/output terminal and the third input/output terminal, wherein:
   a resistance value of the resistor is set in accordance with an isolation and an isolation deviation that are required in the switching circuit.

2. The switching circuit according to claim 1, wherein at least one of the first FET and the second FET includes a plurality of FET elements connected in series with each other between the first input/output terminal and a corresponding input/output terminal from among the second and third input/output terminals, and
   a control terminal of each of the plurality of FET elements is configured to receive a common bias voltage.

3. A high-frequency module comprising:
   the switching circuit according to claim 1; and
   a low-noise amplifier having an input terminal connected to the second input/output terminal.

4. The high-frequency module according to claim 3, further comprising a power amplifier having an output terminal connected to the third input/output terminal.

5. The high-frequency module according to claim 3, further comprising a switch element arranged between the input terminal of the low-noise amplifier and an output terminal of the low-noise amplifier and switches whether or not the input terminal of the low-noise amplifier is short-circuited with the output terminal of the low-noise amplifier.

6. A high-frequency module comprising:
   the switching circuit according to claim 2; and
   a low-noise amplifier having an input terminal connected to the second input/output terminal.

7. A high-frequency module comprising:
   the switching circuit according to claim 1; and
   a low-noise amplifier having an input terminal connected to the second input/output terminal.

8. The switching circuit according to claim 1, wherein:
   the first input/output terminal, the second input/output terminal, and the third input/output terminal are each configured as both an input terminal and an output terminal;
   all constituent elements of the switching circuit are integrated into a semiconductor substrate;
   the inductor includes a spiral inductor formed of a conductive wire coiled on a surface of the semiconductor substrate, wherein the resistor is realized by a resistance component of the spiral inductor;
   the first FET and the second FET are disposed in a transistor region on the surface of the semiconductor substrate, the spiral inductor is disposed in another region on the surface of the semiconductor substrate, and the input/output terminals are disposed in yet another region on the surface of the semiconductor substrate using pads;
   the surface of the semiconductor substrate further includes a middle region disposed between the transistor region and the another region where the spiral inductor is disposed; and
   one end of the spiral inductor is electrically connected to the second input/output terminal in the middle region, and another end of the spiral inductor is electrically connected to the third input/output terminal in the middle region.

9. The switching circuit according to claim 8, wherein a line width of the conductive wire is about 5 mm or less.

10. The switching circuit according to claim 8, wherein a thickness of the conductive wire is about 2 mm or less.

11. The switching circuit according to claim 8, wherein the resistance component of the spiral inductor is realized by a jumper that connects an inner peripheral end portion of the spiral inductor to the second input/output terminal and an outer peripheral end portion of the spiral inductor is connected to the third input/output terminal.

12. The switching circuit according to claim 8, wherein the resistor is realized by a jumper that connects an inner peripheral end portion of the spiral inductor to the second input/output terminal.

* * * * *